United States Patent [19]

Rhieu

[11] Patent Number: 6,143,477
[45] Date of Patent: Nov. 7, 2000

[54] DUAL WAVELENGTH UV LAMP REACTOR AND METHOD FOR CLEANING/ASHING SEMICONDUCTOR WAFERS

[75] Inventor: Ji Hyo Rhieu, Mesa, Ariz.

[73] Assignee: Amtech Systems, Inc., Tempe, Ariz.

[21] Appl. No.: 09/149,864

[22] Filed: Sep. 8, 1998

[51] Int. Cl.⁷ ....................................................... G03F 7/42
[52] U.S. Cl. ............................................. 430/329; 134/1.3
[58] Field of Search .............................. 430/329; 134/1.1, 134/1.2, 1.3

[56] References Cited

U.S. PATENT DOCUMENTS

| | | | |
|---|---|---|---|
| 5,083,030 | 1/1992 | Stavov ................................... | 250/453.1 |
| 5,246,526 | 9/1993 | Yamaguchi et al. .................... | 156/345 |
| 5,547,642 | 8/1996 | Seiwa et al. ............................ | 422/186 |
| 5,747,387 | 5/1998 | Koizumi et al. ........................ | 438/708 |
| 5,762,755 | 6/1998 | McNeilly et al. ....................... | 156/652 |

*Primary Examiner*—Kathleen Duda
*Attorney, Agent, or Firm*—Cahill, Sutton & Thomas P.L.C.

[57] ABSTRACT

A method of ashing or cleaning a wafer, including introducing oxygen gas into a reaction chamber having therein a semiconductor wafer to be ashed or cleaned, producing light of wavelength less than 190 nanometers by means of a first excimer lamp, and directing the light into the oxygen gas, causing generation of ozone gas. Light of wavelength greater than 190 nanometers is produced by means of a second excimer lamp and directed that light into the ozone gas, causing generation of an oxygen radical having a high absorption coefficient. Gas including the oxygen radical is passed along a surface of the wafer, causing degeneration of organic material thereon.

8 Claims, 3 Drawing Sheets

DUAL WAVELENGTH UV LAMP REACTOR AND METHOD FOR CLEANING/ASHING SEMICONDUCTOR WAFERS

BACKGROUND OF THE INVENTION

The invention relates to reactors and methods for cleaning organic materials from semiconductor wafer surfaces and/or for "ashing" photoresist from semiconductor wafer surfaces.

In semiconductor device manufacturing processes, photoresist is used as a mask for etching and ion implantation. The photoresist is removed after the etching or implantation process is complete. Various techniques for removing the photoresist are well known. Such removal of photoresist is referred to as "ashing".

One known ashing technique, referred to as a thermal ozone process, is widely used. This technique eliminates the potential for ion damage and charge up, which is a consequence of the most popular plasma processes, but requires high reaction temperatures of more than approximately 300° Centigrade. This technique requires use of an expensive (roughly $60,000.00) ozone generator. The high reaction temperatures cause reliability problems, one of which is occurrence of miniature explosions of hardened crust on top of the photoresist, referred to as "popping", causing defects in the integrated circuit.

Another type of ashing process is referred to as UV ozone processing. UV ozone ashing techniques can be performed with lower reaction temperatures, and therefore avoid the above "popping" problems. One UV ozone technique, which has been used in equipment marketed by Hitachi for several years, uses mercury resonance lamps having a wavelengths of mostly 254 nm (nanometers) and some of 185 nm. Since the 185 nm intensity of the lamp is too low to achieve a reasonable ozone content, this system has the shortcomings that an expensive ozone generator is required, and the mercury resonance lamp provides inadequate light intensity. Consequently, the reaction rate involving production of an oxygen radical to decompose organic contaminants or photoresist is too low.

Other UV ozone processes and systems which utilize xenon excimer lamps are marketed by Usiho of Japan and Tokyo Cathode Laboratory of Japan. The xenon excimer lamp has a peak output at 172 nm. An oxygen molecule has a high absorption coefficient at this wavelength. Therefore, it can effectively generate ozone and does not require an expensive ozone generator. However, the ozone produced has a low absorption coefficient at that wavelength, resulting in a low reaction rate. The xenon excimer lamp has instantaneous turn-on/turn-off characteristics, unlike the mercury resonance lamp which requires several seconds to stabilize the light intensity after turn-on. This is a significant amount of time in ashing of semiconductor wafers, wherein a wafer is loaded into and unloaded from the ashing reactor approximately every other minute. Photons of the 172 nanometer wavelength quite effectively modify/alter the organic photoresist material composition of the form $C_lH_mO_n$. Unfortunately, the reaction rate is too low if ordinary low power xenon excimer lamps are used. Equipment including higher power xenon excimer lamps which would provide a higher reaction rate is not presently commercially available. Furthermore, xenon excimer lamps have the problem that they produce solarization or colorization of the Suprasil quartz windows which separate the lamp chamber and reaction chamber of an ashing device, resulting in degradation of the transmitted light intensity.

The reaction for the above prior art system using a xenon excimer lamp is given by:

$$O_2 + h\nu(172 \text{ nm}) \rightarrow O(^3P) + O(^1D), \quad \text{(Eq. 1)}$$

wherein $O(^3P)$ and $O(^1D)$ represent oxygen atoms of excited electronic states that react with oxygen gas to produce ozone, as indicated in Eq. 2:

$$O + O_2 + M \rightarrow O_3 + M, \quad \text{(Eq. 2)}$$

where M represents a foreign gas.

$$O_3 + h\nu(172 \text{ nm}) \rightarrow O_2(^1\Delta) + O(^1D), \quad \text{(Eq. 3)}$$

wherein $O_2(^1\Delta)$ represents an oxygen molecule of excited electronic state, and $O(^1D)$ represents an oxygen radical. Ozone has a low absorption coefficient at the 172 nm wavelength emitted by a xenon lamp. Because of this low absorption rate and low light intensity of the low power excimer lamp or rapid light intensity degradation due to solarization of the high power excimer lamp, it is not very effective for ashing or cleaning a wafer.

Thus, there remains an unmet need for an improved ashing and cleaning system and method which overcomes the problems of the prior art.

SUMMARY OF THE INVENTION

Accordingly, it is an object of the invention to provide an ashing and cleaning apparatus and method which provides high reaction rates and fast, effective, stable, and reliable ashing and cleaning, and avoids the need to use an expensive external ozone generator.

It is another object of the invention to avoid solarization of a window in a UV ozone ashing process and reactor.

Briefly described, and in accordance with one embodiment thereof, the invention provides a method of ashing or cleaning a wafer by introducing oxygen gas into a reaction chamber having therein a semiconductor wafer to be ashed or cleaned. Light of wavelength less than 190 nanometers is produced by means of a first excimer lamp and directed into the oxygen gas, causing generation of ozone gas. Light of wavelength greater than 190 nanometers is produced by means of a second excimer lamp and directed into the ozone gas having a high absorption coefficient, causing generation of an oxygen radical at the wavelength. Gas including the oxygen radical is passed along a surface of the wafer, causing degeneration of photoresist or other organic material thereon.

DETAILED DESCRIPTION OF THE PREFERRED EMBODIMENTS

Figure 1A:
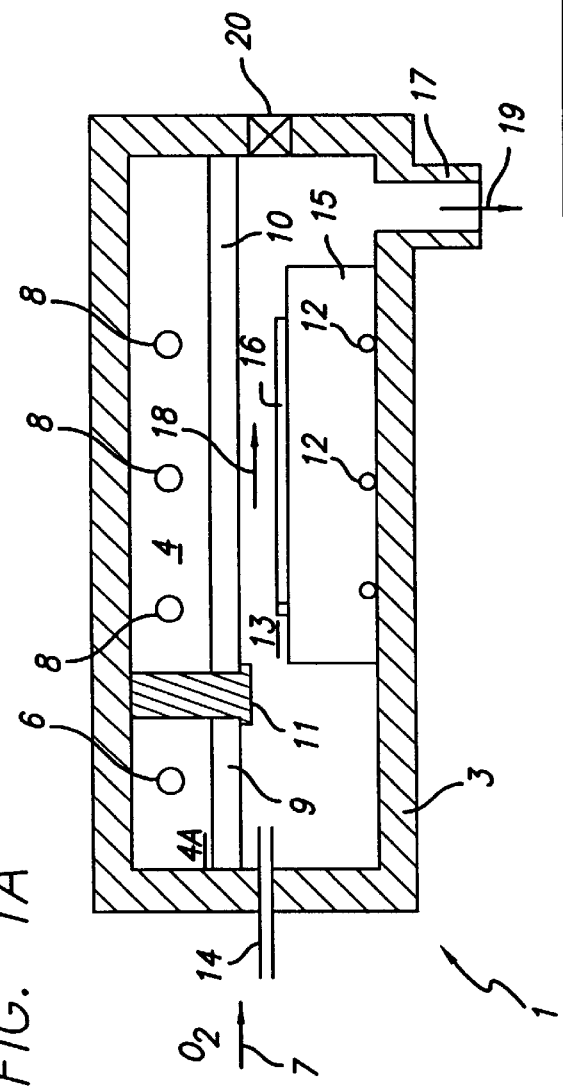
FIG. 1A shows a section view of a first embodiment of the ashing and cleaning system of the present invention.
Figure 1B:
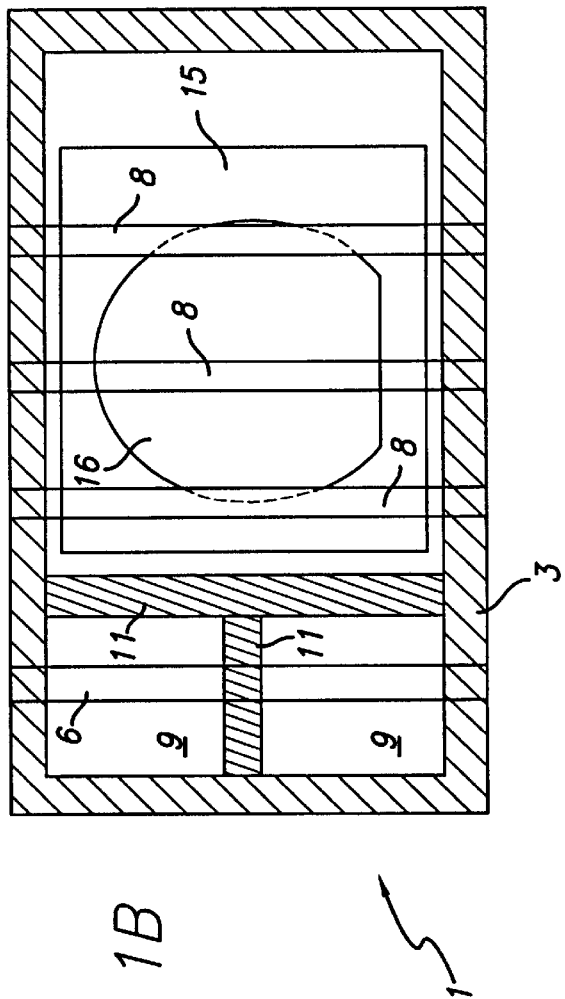
FIG. 1B is a partial section view of the ashing and cleaning system of FIG. 1A.

Referring to FIGS. 1A and 1B, dual wavelength excimer lamp wafer ashing or cleaning system 1 includes a conventional reactor housing 3 including therein an upper lamp chambers 4 and 4A and a lower reaction chamber 13 separated by a window structure. One or more xenon excimer lamps 6 are disposed in lamp chamber 4A above one or more window panes 9 formed of either calcium fluoride or magnesium fluoride. A plurality of longer wavelength excimer lamps 8, such as krypton chloride or krypton fluoride lamps, also are supported in lamp chamber 4, above a portion of the window structure including a Suprasil quartz window pane 10. A pane supporting structure 11 supports edges of both panes 9 and 10 and separates chambers 4A and 4. The calcium fluoride or magnesium fluoride pane 9 under xenon excimer lamp 6, with its peak wavelength of 172 nanometers, is used to avoid the above mentioned colorization and instability that would result if Suprasil quartz material were used.

Reactor 1 includes a gas inlet 14 through which pure oxygen gas is forced into reaction chamber 13. Reaction chamber 13 includes a conventional susceptor 15 having heating elements 12. Semiconductor wafers which need to be ashed or cleaned are loaded in a conventional manner onto susceptor 15 through a suitable door or gate valve 20 in the wall of reaction chamber 13.

After the incoming oxygen passes into reaction chamber 13, a first reaction caused by xenon excimer lamp 6 produces oxygen atoms which then react with available oxygen molecules to produce ozone (and other species). A second reaction then is caused by the krypton chloride (KrCl) or krypton fluoride (KrF) excimer lamps 8 (having peak outputs at 222 nanometers and 248 nanometers, respectively) to produce an oxygen radical. The gas containing oxygen, ozone, and the highly reactive oxygen radicals then passes over wafer 16 on susceptor 15, as indicated by arrow 18, and efficiently decomposes the photoresist and/or other organic contaminants on wafer 16. The gas then is exhausted through an outlet 17, as indicated by arrow 19.

The reaction stimulated by xenon excimer lamp 6 is given by:

$$O_2 + h\nu(172\ nm) \rightarrow O(^3P) + O(^1D),\qquad\text{(Eq. 4)}$$

producing oxygen atoms, wherein $O(^3P)$ and $O(^1D)$ indicate different electronic states of the oxygen molecules.

The oxygen atoms then combine with oxygen molecules to produce ozone, as indicated by the following equation:

$$O + O_2 + M \rightarrow O_3 + M.\qquad\text{(Eq. 5)}$$

The ozone then passes into the portion of reaction chamber 13 under Suprasil quartz pane 10 and, under the influence of the light emitted by krypton fluoride excimer lamps 8, then produces the following reaction:

$$O_3 + h\nu(248\ nm) \rightarrow O_2(^1\Delta) + O(^1D),\qquad\text{(Eq. 6)}$$

wherein the ozone molecule has a high absorption coefficient at 248 nm to generate the oxygen radical $O(^1D)$. (Kyrpton chloride excimer lamps of wavelength 222 nm or chlorine ($Cl_2$) excimer lamps of wavelength of approximately 260 nm also could be used.) The high absorption coefficient of the ozone molecule at the wavelength of the excimer lamps 8 is very important because the higher absorption coefficient provides higher oxygen radical density, resulting in a greater the reaction rate which cause decomposition of the photoresist or organic contaminants on wafer 16.

I expect that in a typical reactor capable of supporting a single 4 to 12 inch semiconductor wafer 16, with an inlet oxygen flow rate of 2 liters per minute, and with the susceptor 15 heated to a temperature of approximately 250° to 275° Centigrade, extremely effective ashing or cleaning of wafer 16 will occur because of the very high light intensity and very high absorption coefficient of the reactant. The temperature of wafer 16 is low enough to avoid the above described "popping". The system requires no external ozone generator; it therefore is relatively inexpensive, yet produces a very high reaction rate.

Figure 4:
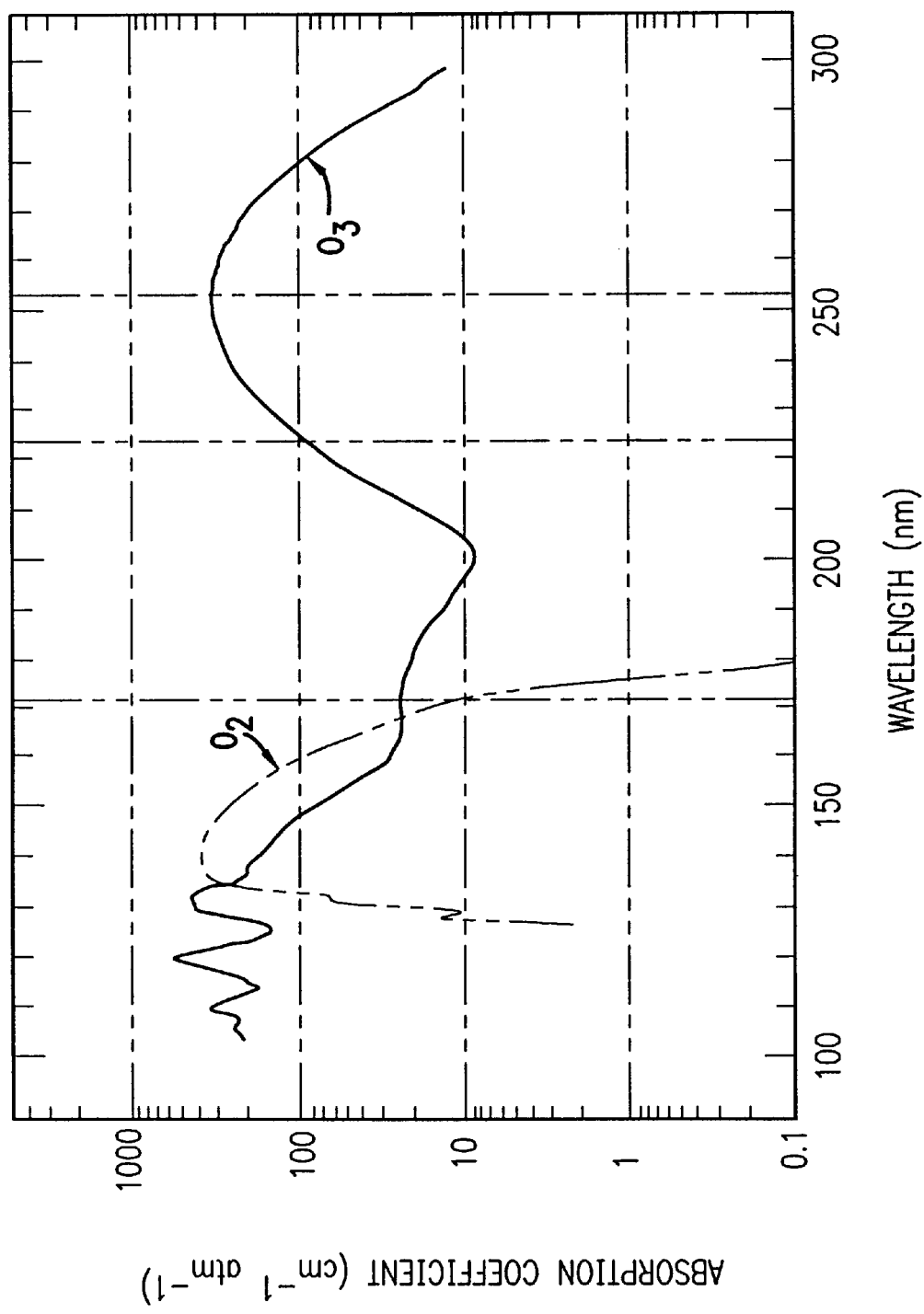
FIG. 4 is a graph showing absorption coefficients of oxygen molecules and ozone molecules in the reactors of FIGS. 1A, 2 and 3.

FIG. 4 is a graph showing the absorption coefficients of oxygen molecules and ozone molecules as a function of wavelength. The absorption coefficient of oxygen molecules is very low for wavelengths above about 190 nanometers. That is, the absorption coefficient of oxygen molecules is too low to efficiently disassociate oxygen molecules at wavelengths above about 190 nanometers. To be safe, it is desirable to use wavelengths less than 190 nanometers to generate oxygen atoms according to Eq. 4 that are needed to then generate ozone molecules according to Eq. 5.

The absorption coefficient of ozone molecules at about 250 nanometers is approximately 300, which is more than an order of magnitude larger than the coefficient at the 172 nanometer wavelength (approximately 23) of the xenon excimer lamp. Therefore, UV light at longer wavelengths (e.g., close to 250 nanometers) is much more effective in (1) stimulating generation of the oxygen radical in Eq. 6 than the 172 nanometer wavelength light produced by the xenon excimer lamp 6, and (2) causing the oxygen radical to react with organic materials such as photoresist on the wafer.

Figure 2:
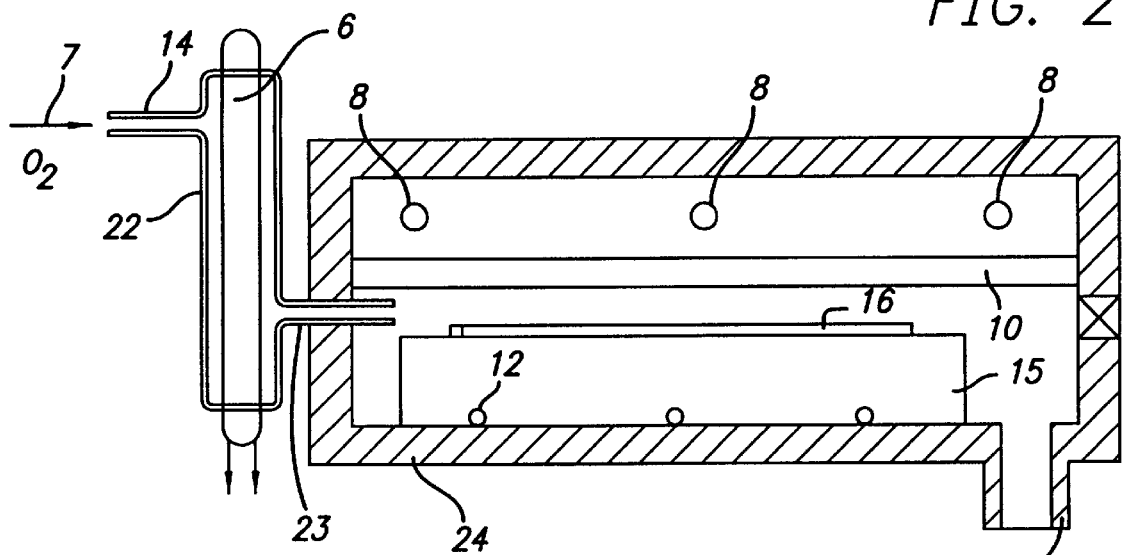
FIG. 2 is a partial section view of an ashing and cleaning system according to a second embodiment of the invention.

FIG. 2 shows an alternate embodiment of the invention in which the excimer lamp 6 is included alone in a first reaction chamber 22 into which the pure oxygen gas flows through inlet 14. The oxygen gas flows around the entire surface of xenon excimer lamp 6, causing effective reaction according to Eqs. 4 and 5 above. The resulting ozone then is piped via conduit 23 into a second reactor 24 including an upper lamp chamber in which krypton chloride or krypton fluoride lamps are located. A lower reaction chamber in which susceptor 15, heating elements 12, supporting wafers 16 are disposed. A Suprasil quartz window pane 10 separates the lamp chamber 24A from the reaction chamber 24B. The reaction of Eq. 6 then is carried out in reaction chamber 24B.

Figure 3:
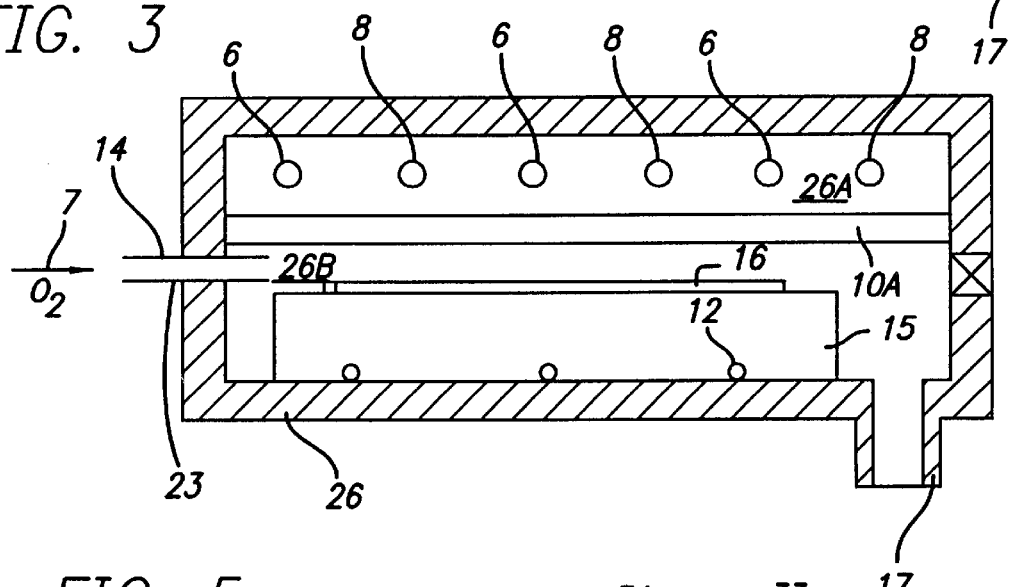
FIG. 3 is a section view of an ashing and cleaning system according to a third embodiment of the invention.

A third embodiment of the invention is shown in FIG. 3, in which a single transparent pane 10A separates a lamp chamber 26A from a reaction chamber 26B in a reactor 26. Here a plurality of excimer xenon lamps 6 are located throughout lamp chamber 26, interspersed with the higher wavelength excimer lamps 8. This structure will be effective if window 10A is formed of panes such as calcium fluoride or magnesium fluoride which do not undergo solarization as a result of the light produced by the xenon excimer lamp. At the present time calcium fluoride or magnesium fluoride panes can not be made large enough for this purpose.

Figure 5:
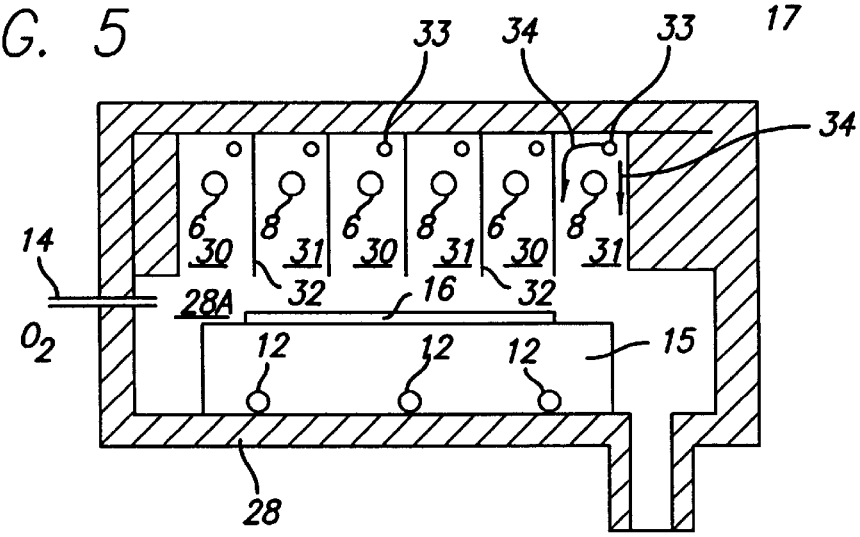
FIG. 5 is a sect ion view of an ashing and cleaning system according to a fourth embodiment of the invention.

A fourth embodiment of the invention is shown in FIG. 5, in which no transparent panes are provided between the UV lamps 6 and 8 and the reaction chamber 28A in which susceptor 15 and wafer 16 are located. Instead, the reactor 28 includes a plurality of vertical lamp chambers 30 and 31 as shown. A xenon excimer lamp 6 is located in the upper portion of each lamp chamber 30, and a krypton fluoride excimer lamp 8 is disposed in the upper portion of each lamp chamber 31. Vertical walls 32 separate the lamp chambers 30 and 31, which can be positioned in an alternating fashion as shown. Or, the xenon lamp 6 can be placed in the upstream chambers and the krypton fluoride lamp can be placed in the downstream lamp chambers. An inert gas purge tube 33 opens into the upper portion of each of lamp chambers 30 and 31 to provide purge gas from an external source. Arrows 34 illustrate the flow of purge gas around the excimer lamps.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, UV lamps which are not excimer lamps, such as an electrodeless microwave excited lamps, could be used.

What is claimed is:

1. A method of ashing or cleaning a wafer, comprising:
   (a) introducing oxygen gas into an apparatus including a reaction chamber having therein a semiconductor wafer to be ashed or cleaned;
   (b) producing first light of wavelength by means of a first UV (ultraviolet) lamp, and directing the first light into the oxygen gas, causing generation of ozone gas, the first UV lamp being a xenon eximer lamp;
   (c) producing second light of wavelength by means of a second UV lamp, and directing that second light into the ozone gas having a high absorption coefficient, causing generation of oxygen radicals, the second UV lamp being one of a krypton chloride lamp and a krypton fluoride lamp; and
   (d) passing gas including the oxygen radicals along a surface of the wafer in the reaction chamber, causing degeneration of organic material thereon.

2. The method of claim 1 including heating the wafer to a temperature of approximately 250 to 275° Centigrade before step (d).

3. The method of claim 1 wherein the organic material includes photoresist.

4. The method of claim 1 wherein step (b) includes providing the first type of UV lamp in a first lamp chamber separated from the reaction chamber by a first transparent pane so that the first light passes through the first pane and into the oxygen gas to produce the ozone upstream from the semiconductor wafer.

5. The method of claim 4 including providing the first transparent pane of one of calcium fluoride and magnesium fluoride.

6. The method of claim 5 including providing the second type of UV lamp in a second lamp chamber separated by a second transparent pane downstream from the first pane so the second light passes through the second pane into the ozone gas to produce the oxygen radical.

7. The method of claim 6 including providing the second pane of quartz material, adjacent to the semiconductor wafer.

8. The method of claim 1 wherein step (b) includes passing the oxygen gas along a surface of the first type of UV lamp and then introducing the ozone gas into the reaction chamber before performing step (c).

* * * * *